(12) United States Patent
Fischer et al.

(10) Patent No.: US 7,557,001 B2
(45) Date of Patent: Jul. 7, 2009

(54) SEMICONDUCTOR PROCESSING METHODS

(75) Inventors: Mark Fischer, Boise, ID (US);
Terrence B. McDaniel, Boise, ID (US)

(73) Assignee: Micron Technology, Inc., Boise, ID (US)

(*) Notice: Subject to any disclaimer, the term of this patent is extended or adjusted under 35 U.S.C. 154(b) by 545 days.

(21) Appl. No.: 11/175,864

(22) Filed: Jul. 5, 2005

(65) Prior Publication Data

US 2007/0010084 A1    Jan. 11, 2007

(51) Int. Cl.
*H01L 21/8234* (2006.01)

(52) U.S. Cl. ............... 438/238; 438/241; 257/E27.084; 257/E21.646

(58) Field of Classification Search .................. 438/238, 438/241, FOR. 220, 637, 638; 257/E21.579
See application file for complete search history.

(56) References Cited

U.S. PATENT DOCUMENTS

2001/0041405 A1*  11/2001  Aoki ........................... 438/254

* cited by examiner

*Primary Examiner*—Michelle Estrada
(74) *Attorney, Agent, or Firm*—Wells St. John P.S.

(57) ABSTRACT

The invention includes methods of forming electrically conductive material between line constructions associated with a peripheral region or a pitch region of a semiconductor substrate. The electrically conductive material can be incorporated into an electrically-grounded shield, and/or can be configured to create a magnetic field bias. Also, the conductive material can have electrically isolated segments that are utilized as electrical jumpers for connecting circuit elements. The invention also includes semiconductor constructions comprising the electrically conductive material between line constructions associated with one or both of the pitch region and the peripheral region.

18 Claims, 8 Drawing Sheets

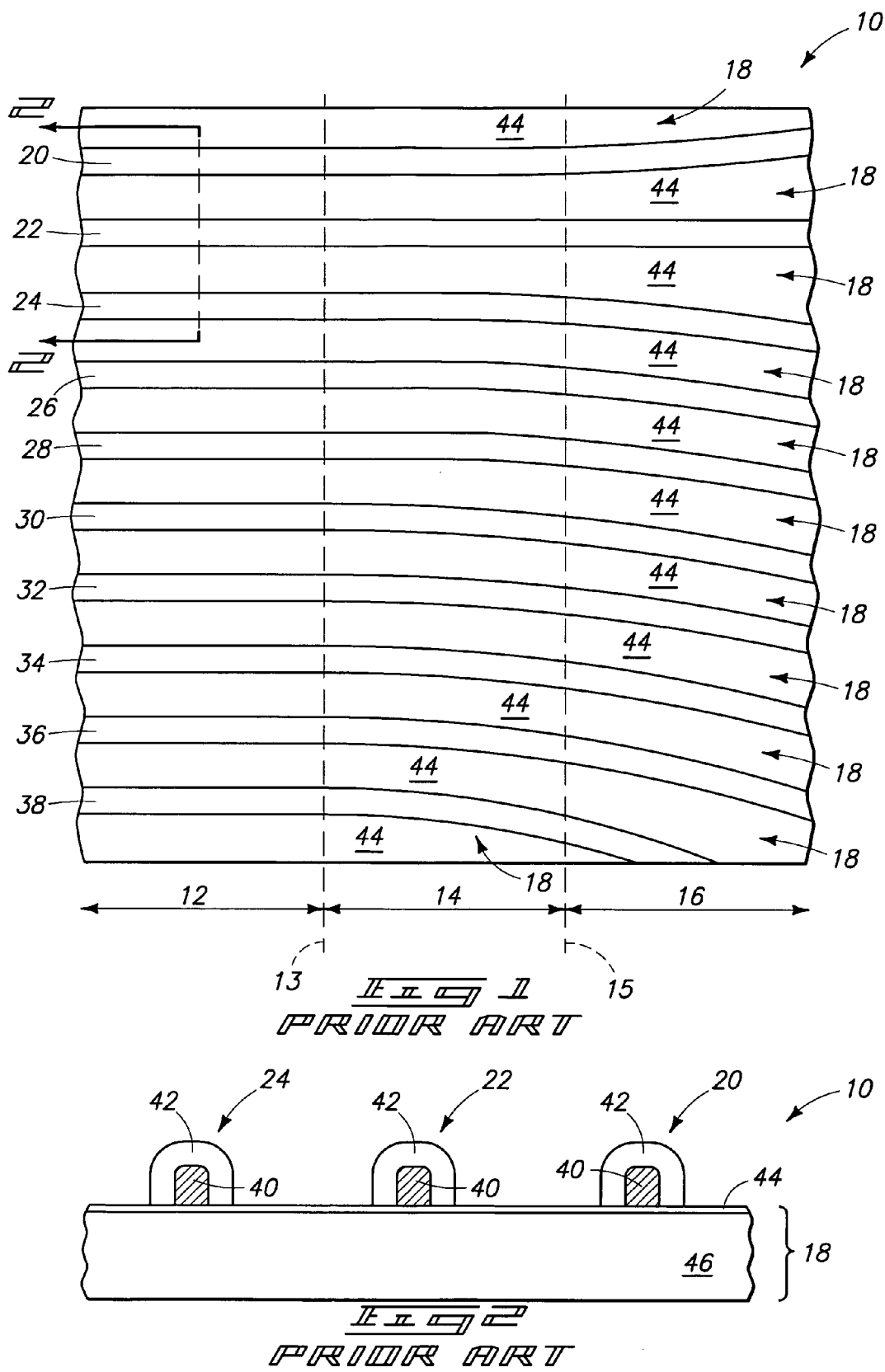

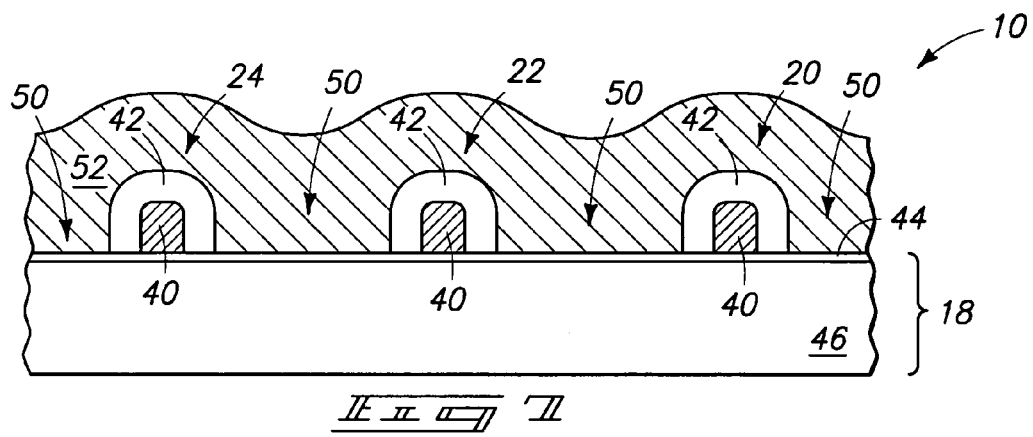
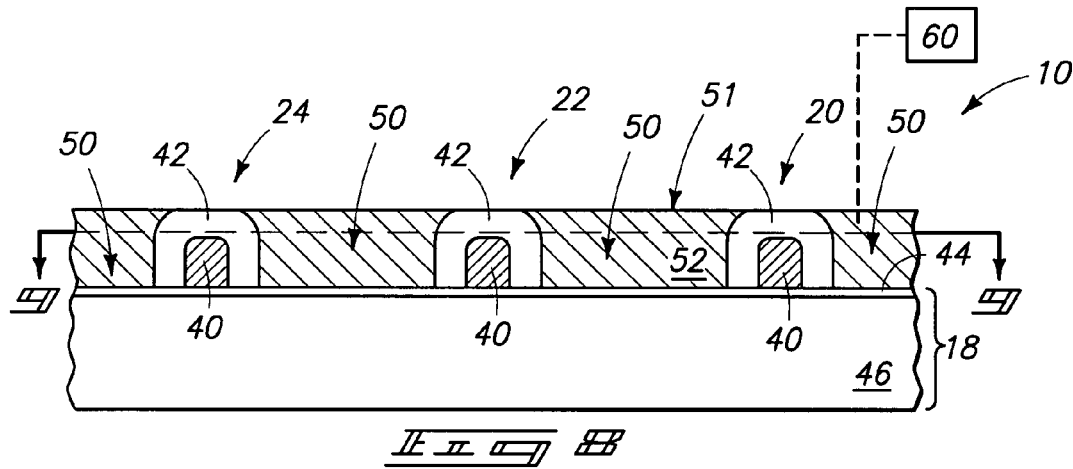
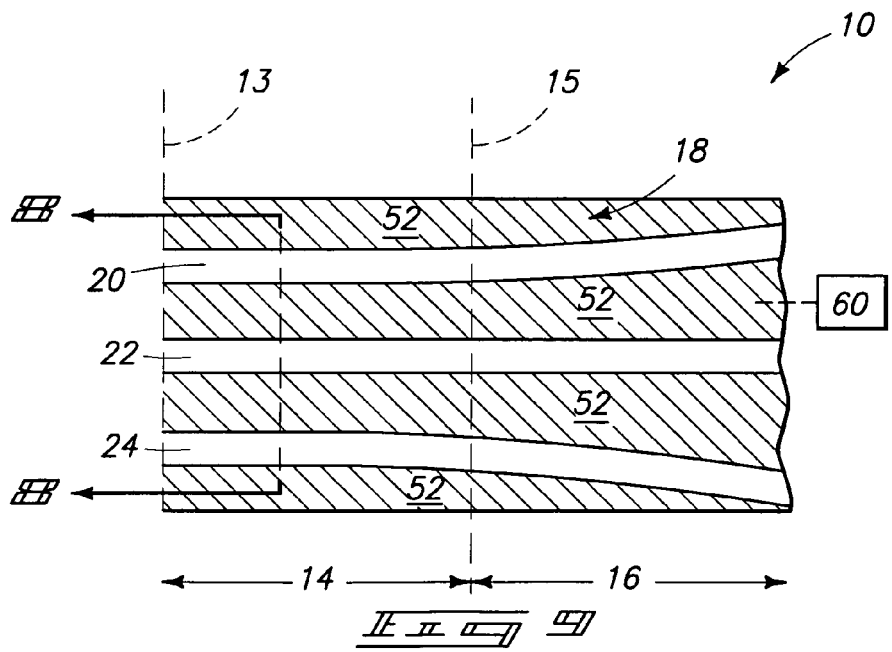

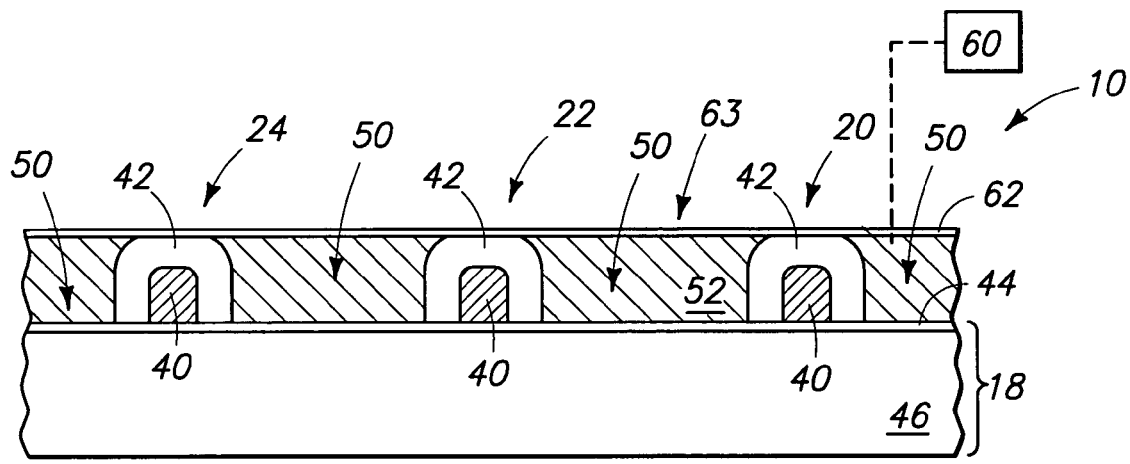
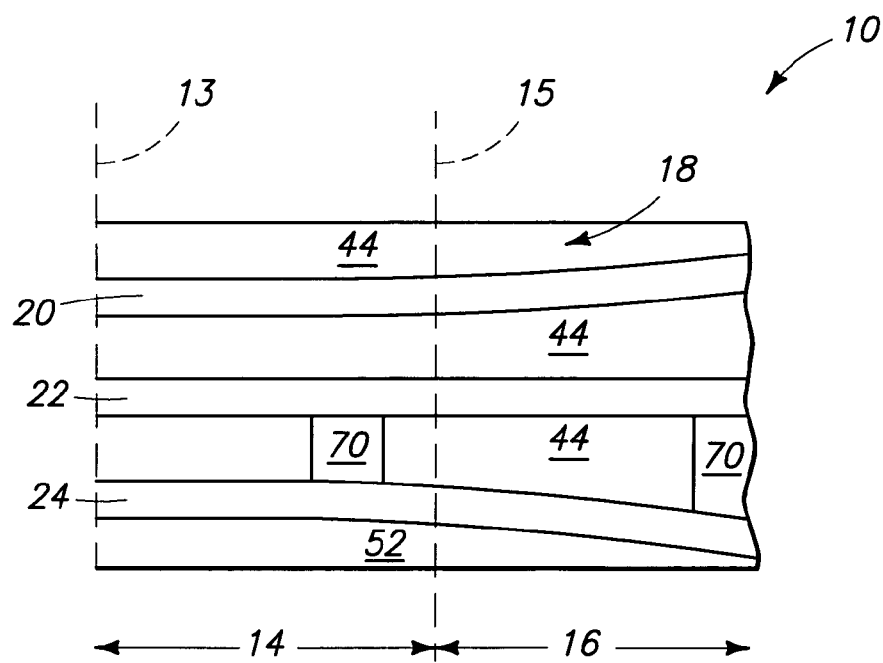

SEMICONDUCTOR PROCESSING METHODS

TECHNICAL FIELD

The invention pertains to semiconductor processing methods and to semiconductor constructions.

BACKGROUND OF THE INVENTION

Semiconductor constructions containing integrated memory can often be considered to comprise three distinct regions. One of the regions is a memory array region which contains a large number of tightly-packed lines (wordlines and bitlines) and data-storage structures (such as, for example, capacitors in dynamic random access memory (DRAM)); a peripheral region containing loosely-packed structures and having logic circuitry utilized for accessing memory cells associated with the memory array; and a pitch region where loosely-packed circuitry from the peripheral region is brought into a tightly-packed configuration to interface with the circuitry of the tightly-packed memory array region. For instance, a typical series of wordlines can be considered to have segments that are tightly-packed within the memory array region, segments loosely-packed within the peripheral region, and segments within the pitch region which connect the segments of the peripheral region to the segments of the memory array region. The pitch region thus makes the transition from the loosely-packed configuration of the peripheral region to the tightly-packed configuration of the memory array region.

Although there typically are not absolute boundaries between the peripheral region and the pitch region, or between the pitch region and the memory array region, persons of ordinary skill in the art generally recognize that the three regions exist across a semiconductor wafer comprising integrated memory, and can agree on the general locations of the three regions relative to one another.

FIG. 1 shows a fragment of a semiconductor wafer construction 10 illustrating the relationships between a memory array region 12, pitch region 14 and peripheral region 16. An approximate boundary between the memory array region and pitch region is illustrated with the dashed line 13, and an approximate boundary between the pitch region and the peripheral region is illustrated with a dashed line 15.

The construction 10 comprises a substrate 18 having a plurality of lines 20, 22, 24, 26, 28, 30, 32, 34, 36, and 38 extending thereover. The lines have segments within the memory array region 12, and such segments can correspond to, for example, either wordlines or bitlines. The segments of the lines within the memory array region 12 are tightly-packed, and typically would be packed to about the limits achievable with the fabrication process utilized to form the lines. Lines 20, 22, 24, 26, 28, 30, 32, 34, 36, and 38 also have segments extending over peripheral region 16, and such segments are relatively loosely-packed as compared to the packing across memory array region 12.

The pitch region comprises a transition from loosely-packed structures along the boundary 15 with the peripheral region to tightly-packed structures along the boundary 13 with the memory array region.

FIG. 2 illustrates a cross-sectional view through the line segments 20, 22 and 24. Such view shows that the line segments comprise electrically conductive core regions 40 surrounded by electrically insulative shells 42 (the shells can also be referred to as liners or coverings). The core regions 40 can comprise any suitable electrically conductive composition or combination of compositions. For instance, the electrically-conductive material of the core regions 40 can comprise various metals, metal compositions and/or conductively-doped semiconductor materials (such as, for example, conductively-doped silicon). In some aspects, the core regions 40 can comprise stacks of electrically-conducted material, such as, for example, stacks containing various metals and/or metal compositions over conductively-doped semiconductor material.

The electrically insulative shell 42 can comprise any suitable electrically insulative composition or combination of compositions. For instance, the electrically-insulative shell can comprise, consist essentially of, or consist of silicon nitride, silicon dioxide, and/or silicon oxynitride. In some aspects, the shell 42 will comprise sidewall spacers joining an electrically insulative cap, as is known to persons of ordinary skill in the art.

The substrate 18 is shown comprising an electrically-insulative layer 44 over a bulk material 46. Electrically insulative layer 44 can, for example, comprise, consist essentially of, or consist of silicon dioxide; and bulk material 46 can comprise, consist essentially of, or consist of monocrystalline silicon which may or may not be lightly background-doped with appropriate dopant. The combination of materials 46 and 44 can be referred to as a semiconductor substrate in some aspects of the invention, or in other aspects it can be material 46 alone which is referred to as a semiconductor substrate, or in yet other aspects the term semiconductor substrate can comprise materials 44 and 46 together with other materials. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although the shown substrate 18 comprises a bulk material 46, it is to be understood that the material 46 can instead comprise various levels of integrated circuitry which are formed beneath the lines 20, 22 and 24. Specifically, as is known to persons of ordinary skill in the art, semiconductor devices will typically comprise multiple layers of integrated circuitry stacked over one another. The shown processing of FIGS. 1 and 2 can be utilized to form a first level of integrated circuitry over a semiconductive-material wafer, or can be utilized to form a later level which is formed over previous levels.

In subsequent processing, additional levels can be formed over the structure of FIGS. 1 and 2. For instance, FIG. 3 shows the construction of FIG. 2 after dielectric filler material 48 is provided over and between lines 20, 22 and 24. The dielectric filler material can comprise any suitable composition or combination of compositions, and in particular aspects will comprise, consist essentially of, or consist of one or more of spin-on-dielectric (SOD), borophosphosilicate glass (BPSG), phosphosilicate glass (PSG) and silicon dioxide. The dielectric filler material is shown having a planarized upper surface 49, which can be formed by, for example, chemical-mechanical polishing. In subsequent processing, another layer of integrated circuitry can be formed on top of planarized upper surface 49.

FIG. 4 shows a top view of the construction 10 at the processing stage of FIG. 3, and shows that the dielectric filler material 48 can extend over the memory array region 12, pitch region 14 and peripheral region 16.

A continuing goal of semiconductor device fabrication is to improve device performance, and preferably to accomplish such improvement without substantial modification of existing semiconductor fabrication processes that would require significant investment in additional equipment. Thus, it would be desirable to develop methodologies for improving on constructions of the type described in FIGS. 1-4 without introducing deviations that would require significant investment in new equipment for existing fabrication processes.

SUMMARY OF THE INVENTION

In one aspect, the invention includes a semiconductor processing method. A semiconductor substrate is provided which has a memory array region, a peripheral region proximate the memory array region, and a pitch region between the memory array region and the peripheral region. A plurality of spaced-apart line constructions are provided to extend over the peripheral region and the pitch region. The line constructions contain electrically conductive lines within electrically insulative shells. An electrically conductive material is formed over and between segments of the line constructions over one or both of the pitch region and the peripheral region.

In one aspect, the invention includes a method of semiconductor processing. A semiconductor substrate is provided which has a memory array region, a peripheral region proximate the memory array region, and a pitch region between the memory array region and the peripheral region. The substrate has an uppermost surface, with a horizontal direction being defined to extend along the uppermost surface of the substrate. A plurality of horizontally-elongated conductive elements are provided to extend over one or both of the peripheral region and the pitch region. The horizontally-elongated conductive elements contain electrically conductive lengths within electrically insulative shells. An electrically insulative material is formed between the horizontally-elongated conductive elements. At least some of the electrically insulative material is removed from between the horizontally-elongated conductive elements to leave trenches between the horizontally-elongated conductive elements. An electrically conductive material is formed within the trenches.

In one aspect, the invention includes a semiconductor construction. The construction comprises a semiconductor substrate having a memory array region, a peripheral array region proximate the memory array region, and a pitch region between the memory array region and the peripheral region. A plurality of spaced-apart line constructions extend over the peripheral region and the pitch region. The line constructions contain electrically conductive lines within electrically insulative shells. Segments of the line constructions over the pitch regions are defined as line constructions of the pitch region, and segments of the line constructions over the peripheral region are defined as line constructions of the peripheral region. An electrically conductive material is between the line constructions of one or both of the pitch region and the peripheral region.

BRIEF DESCRIPTION OF THE DRAWINGS

Preferred embodiments of the invention are described below with reference to the following accompanying drawings.

FIG. 1 is a diagrammatic, top view of a semiconductor wafer fragment illustrating a prior art arrangement of conductive lines across a peripheral region, pitch region and memory array region.

FIG. 2 is a diagrammatic, cross-sectional view of a portion of the FIG. 1 fragment, and is along the line 2-2 of FIG. 1.

FIG. 7 is a view of the FIG. 6 fragment shown at a processing stage subsequent to that of FIG. 6.

FIG. 8 is a view of the FIG. 6 fragment shown at a processing stage subsequent to that of FIG. 7.

FIG. 9 is a view of the FIG. 5 fragment shown at the processing stage of FIG. 8, with the cross-section of FIG. 8 being along the line 8-8 of FIG. 9 and the view of FIG. 9 being along the line 9-9 of FIG. 8.

FIG. 10 is a view of the FIG. 6 fragment shown at a processing stage subsequent to that of FIG. 8.

FIG. 11 is a view of the FIG. 5 fragment shown at a processing stage subsequent to that of FIG. 5 in accordance with another aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes aspects in which electrically-conductive material is provided between lines of the pitch and/or peripheral regions of a semiconductor substrate. The electrically conductive material can replace conventionally-utilized dielectric material, and can provide several advantages. For instance, the electrically-conductive material can be utilized as a ground, or can be utilized to provide electrically-conductive jumpers for circuitry that is elevationally above and/or below the level of the conductive material. Also, in some aspects, the electrically conductive material can be provided with a current passing therethrough to form a magnetic field bias opposing a magnetic field generated by current flowing through lines of the pitch and/or peripheral region.

An exemplary aspect of the invention is described with reference to FIGS. 5-10. In referring to FIGS. 5-10, similar numbering will be used as was utilized above in describing the prior art of FIGS. 1-4, where appropriate.

Figures 3, 4:
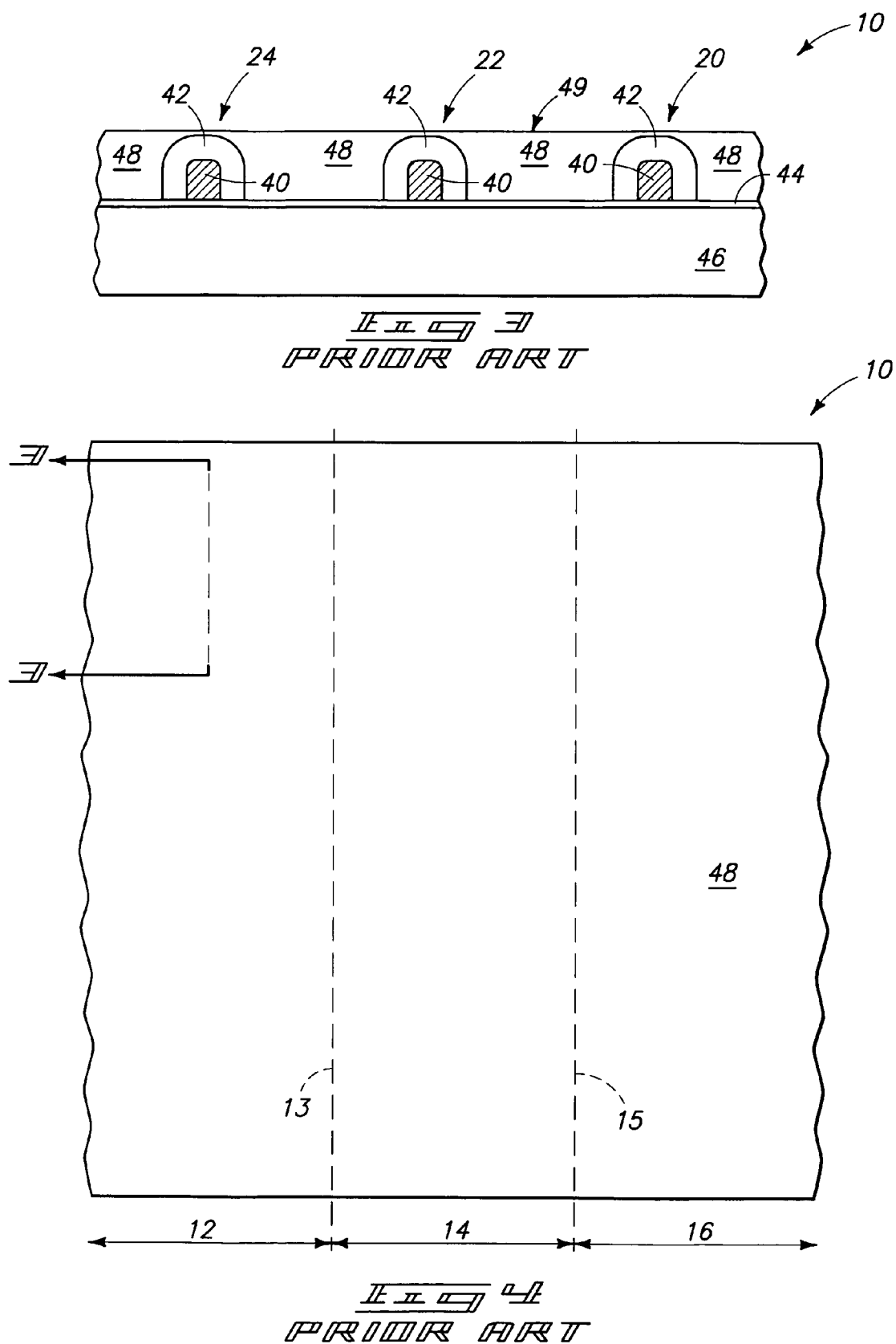
FIG. 3 is a view of the FIG. 2 construction as shown at a processing stage subsequent to that of FIG. 2 in accordance with a prior art process.
FIG. 4 is a view of the FIG. 1 fragment shown at the processing stage of FIG. 3, with the cross-section of FIG. 3 being along the line 3-3 of FIG. 4.
Figure 5:
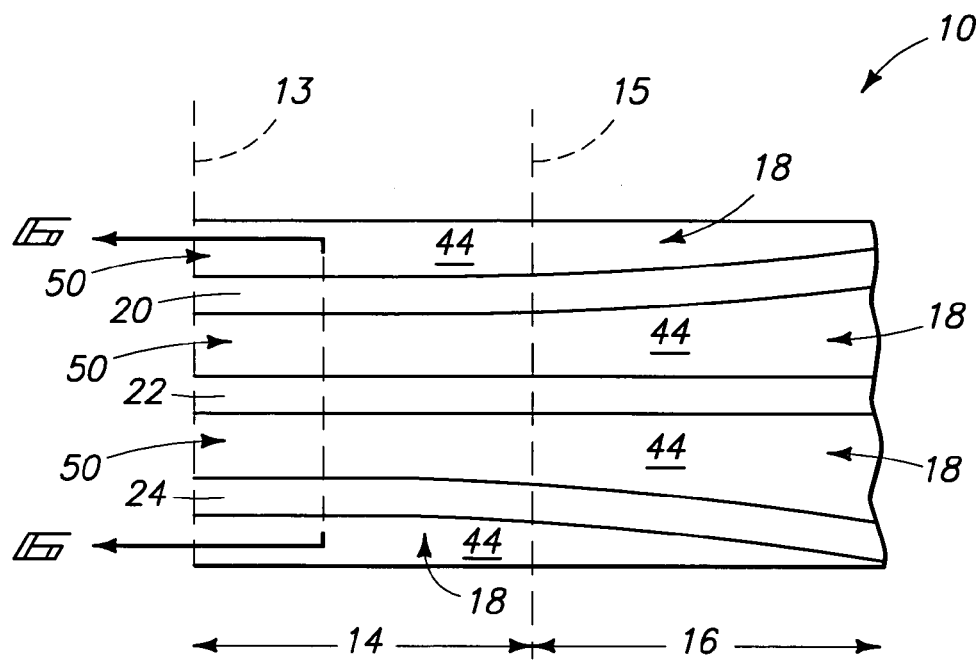
FIG. 5 is a top view of a semiconductor wafer fragment shown at a preliminary processing stage in accordance with an aspect of the present invention. The fragment comprises a peripheral region and a pitch region.
Figure 6:
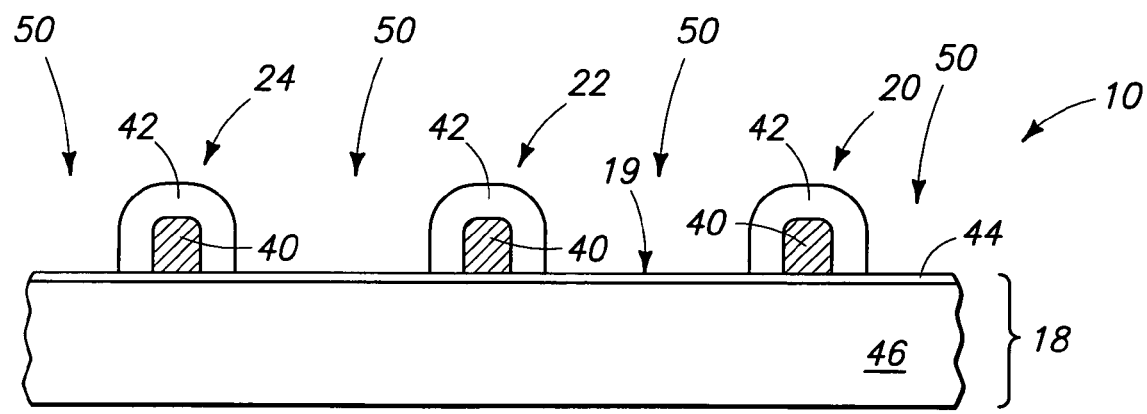
FIG. 6 is a cross-sectional view along the line 6-6 of FIG. 5.

Referring initially to FIGS. 5 and 6, a portion of the semiconductor wafer fragment 10 is illustrated at the processing stage of FIGS. 1 and 2 that was discussed above. The construction includes the lines 20, 22 and 24 extending across the substrate 18. The portion of the construction illustrated in FIG. 5 is only a portion extending across pitch region 14 and peripheral region 16, as such portion is the pertinent portion in preferred aspects of the invention.

The lines 20, 22 and 24 can be referred to as spaced-apart line constructions in some aspects of the invention, since the line constructions are separated by intervening gaps extending to substrate 18. The term "line construction" is to be understood to refer to a structure comprising a conductive line and any insulative material extending along the conductive line. Thus, the line constructions of FIG. 5 comprise both the conductive material 40 of the lines and the insulative shell 42 extending around and along the conductive material. The shown line constructions have segments extending across the pitch region 14, and also have segments extending over the peripheral region 16. The segments extending over the pitch region can be defined as line constructions of the pitch region, and the segments of the constructions over the peripheral region can be defined as line constructions of the peripheral region in the discussion and claims that follow.

Although the structures 20, 22 and 24 have been described as line constructions, it is to be understood that the invention can be utilized with other conductive structures besides those generally understood to be line constructions.

In some aspects of the discussion and claims that follow, an upper surface 19 of substrate 18 is utilized to define a horizontal direction. Specifically, such horizontal direction is defined as a direction extending along the uppermost surface of the substrate 18 (and accordingly a vertical direction would correspond to a direction extending through the thickness of substrate 18 and orthogonally as shown substantially-planar upper surface 19 of substrate 18). The structures 20, 22 and 24 can then be understood to correspond to a plurality of horizontally-elongated elements which extend over the peripheral region and pitch region, and which contain electrically-conductive lengths corresponding to conductive material 40. Though the horizontally-elongated elements are shown extending over both the peripheral region and pitch region, it is to be understood that at least some of the elements may extend over only one of the peripheral region or pitch region, rather than over both.

The construction of FIGS. 5 and 6 can be understood to comprise trenches 50 extending between structures 20, 22 and 24. Such construction can be arrived at relative to the above-discussed prior art constructions of FIGS. 1-4 through various methods. For instance, the construction of FIGS. 5 and 6 can be considered to be identical to the construction of FIGS. 1 and 2, and accordingly can be arrived at simply by performing the prior art processing of FIGS. 1 and 2 without the additional processing of FIGS. 3 and 4. Alternatively, the construction of FIGS. 5 and 6 can be considered to correspond to a processing stage subsequent to that FIGS. 3 and 4 which is arrived at by removing the insulative material 48 from between structures 20, 22 and 24 to form the trenches 50. If the construction of FIGS. 5 and 6 is arrived at by removing the dielectric material 48, the invention can include aspects in which some but not all of the dielectric material is removed from between the structures 20, 22 and 24, as well as the shown aspect in which all of the dielectric material has been removed from between the constructions 20, 22 and 24. The trenches 50 can alternatively be referred to as gaps in some aspects of the invention.

Referring to FIG. 7, an electrically conductive material 52 is formed within trenches 50. In the shown aspect, the conductive material extends over structures 20, 22 and 24, as wells as between the structures. Conductive material 52 can comprise any suitable composition or combination of compositions, and can, for example, comprise, consist essentially of, or consist of one or more of metal, metal compounds and conductively-doped semiconductor material (such as, for example, conductively-doped silicon).

Referring to FIGS. 8 and 9, an uppermost surface of material 52 is planarized to form the substantially planar surface 51. Such planarization can comprise, for example, chemical-mechanical polishing. The shown planarization has formed the uppermost surface 51 extending across the insulative material 42 of line constructions 20, 22 and 24. It is to be understood, however, that the invention also includes aspects in which the planarization does not extend to, or through, insulative material 42.

The conductive material 52 is shown extending over both the pitch region 14 and periphery region 16 in the aspect of the invention of FIGS. 8 and 9. It is to be understood, however, that the invention also encompasses aspects in which the conductive material extends over one of the peripheral and/or pitch region but not the other. Such aspects can be accomplished by providing a protective masking material over the region where the conductive material 52 is not desired during the formation of material 52 within the desired region. A memory array region of the construction 10 is not shown in FIGS. 8 and 9, but could be proximate the pitch region (as described above with reference to FIG. 1); and it is to be understood that the conductive material may or may not remain over the memory array region at the processing stage of FIGS. 8 and 9.

The conductive material 52 can be utilized as is to be a large conductive shield extending along the line constructions 20, 22 and 24. In some aspects, the conductive material 52 can be electrically-coupled to either a power source or a ground. A box 60 is shown in FIGS. 8 and 9 to diagrammatically illustrate optional coupling of electrically conductive material 52 to either a power source or ground. Specifically, the box 60 is shown coupled to conductive material 52 through a dashed line, with such dashed line illustrating optional coupling. In aspects in which the conductive material is to be utilized as a conductive shield, the planarization of FIGS. 8 and 9 can be conducted to leave the conductive material over the line constructions 20, 22 and 24 so that the conductive material fully surrounds the portions of the line constructions over substrate 18.

In some aspects, the box 60 can correspond to a ground which is coupled to conductive material 52 so that the entirety of conductive material 52 becomes an electrically grounded shield. In some aspects, all of the conductive material 52 can be electrically coupled together so that a single connection to ground is sufficient to electrically ground all of the material 52, and in other aspects it can be desired to have multiple connections to ground extending to various regions of material 52 that are otherwise electrically isolated from one another so that all of the material 52 that is desired to be grounded becomes grounded.

In some aspects of the invention, box 60 can correspond to a power source and can be utilized to provide electrical current to material 52. In particular aspects, current flow can be provided within material 52 to create a magnetic bias proximate the conductive lines 20, 22 and 24. Such can be desirable in order to add further control to the flow of current through lines 20, 22 and 24. Specifically, the flow of current through lines 20, 22 and 24 will create a magnetic field, and the magnetic bias created by current flow through conductive material 52 can be provided to, for example, either oppose the field created by the current flow within the conductive lines or to be in the same direction as the magnetic field created by the current flow within the conductive lines. Typically, it will be preferred for the magnetic bias created within conductive material 52 to oppose the magnetic field created within the conductive lines because this can minimize, or at least reduce, cross-coupling and parasitic capacitances (cross-talk). In any event, the magnetic bias created by current flow through material 52 can interact with the magnetic field created by current flow within the conductive lines 20, 22 and 24 to provide an opportunity for additional control over current flow within lines 20, 22 and 24 that did not exist in the absence of conductive material 52. In some aspects, the current flow through material 52 can be varied iteratively until conditions are ascertained which appropriate to minimize cross-talk.

Referring next to FIG. 10, a dielectric material 62 is formed over conductive material 52, and provided with a planarized upper surface 63. Such planarized upper surface can be formed by, for example, chemical-mechanical polishing of dielectric material 62. The dielectric material 62 can comprise any suitable composition or combination of compositions, and in particular aspects can comprise, consist essentially of, or consist of silicon dioxide (in some aspects deposited from tetraethyl orthosilicate (TEOS)), PSG or BPSG. In subsequent processing (not shown) another layer of circuitry can be formed over dielectric material 62.

The aspect of FIGS. 5-10 can form conductive material 52 to be continuous around the line structures 20, 22 and 24 so that all of the conductive material 52 is electrically unbroken. In some aspects, however, it can be desired that the material 52 have isolated segments. The isolated segments can, for example, be useful as conductive jumpers for electrically connecting circuitry which is either above or below an elevational level of conductive material 52. FIGS. 11-18 illustrate exemplary aspects of the invention in which conductive material 52 is formed to have electrically isolated segments.

Referring to FIG. 11, construction 10 is shown at a processing stage similar to that of FIGS. 5 and 6, but with the addition of a pair of electrically insulative segments 70 provided between line structures 22 and 24. The segments 70 can be formed of any suitable material, and in particular aspects will comprise one or more of silicon dioxide and silicon nitride. The segments 70 can be formed with any suitable method, including, for example, formation of a layer of material 70 across the entirety of construction 10 and utilization of a photolithographically patterned mask to impart a desired pattern into the material 70 to thereby form the shown segments.

Figure 12:
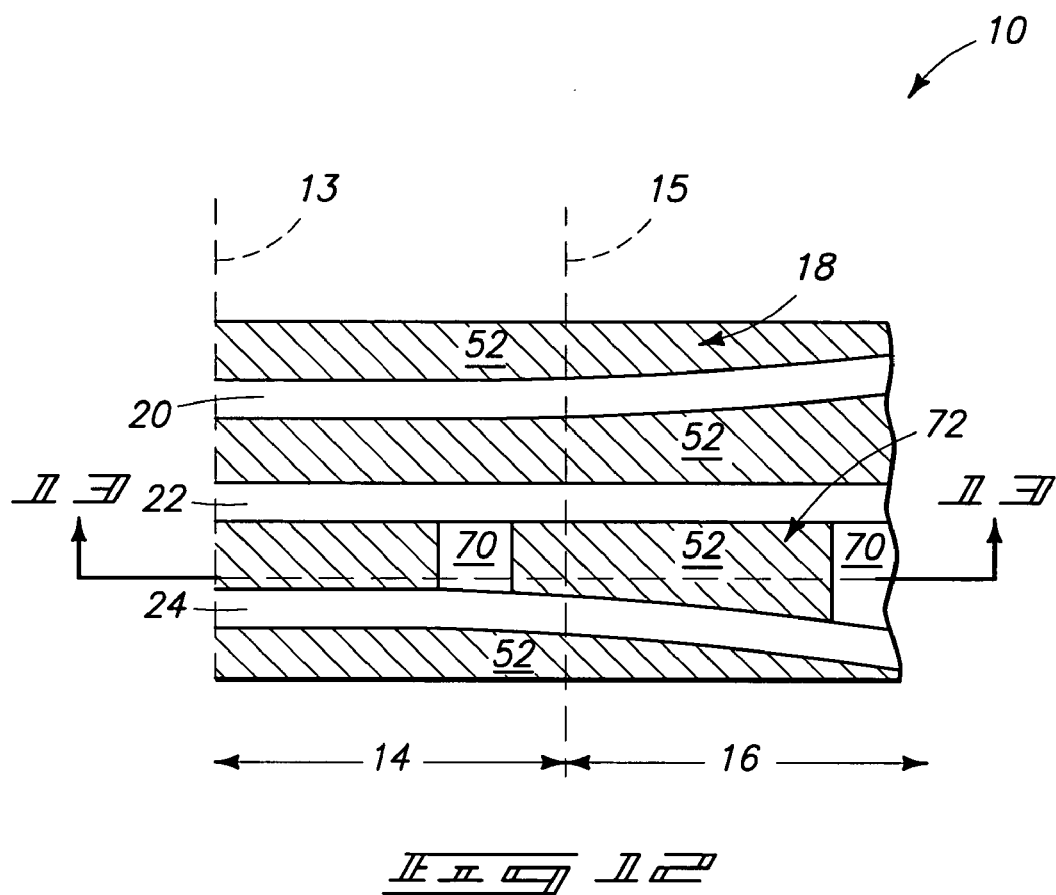
FIG. 12 is a view of the FIG. 5 fragment shown at a processing stage subsequent to that of FIG. 11, and shown in cross-sectional top view.
Figure 13:
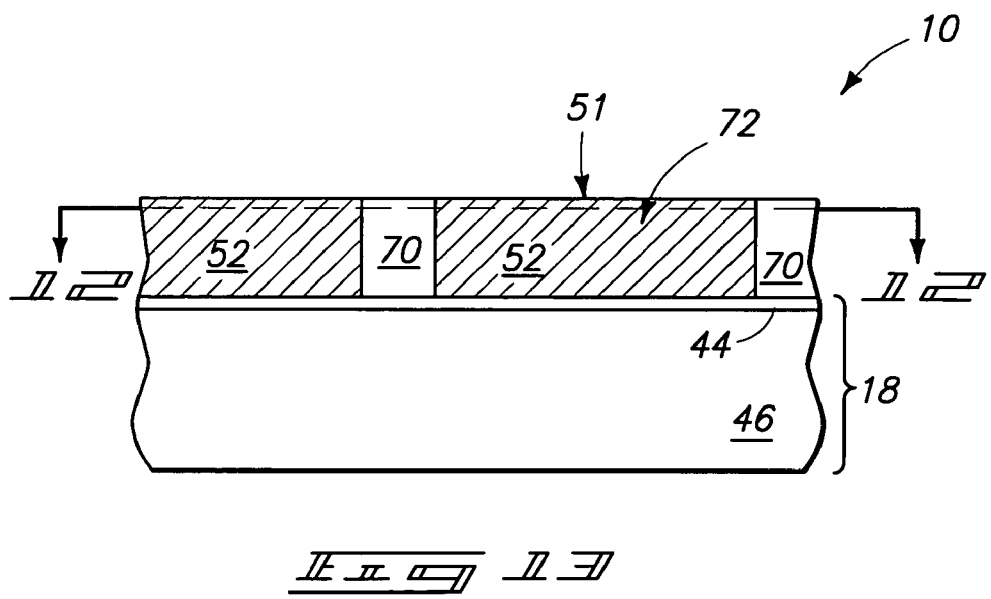
FIG. 13 is a cross-sectional side view along the line 13-13 of FIG. 12. The cross-section of FIG. 12 is along the line 12-12 of FIG. 13.

Referring next to FIGS. 12 and 13, electrically conductive material 52 is provided to be between line constructions 20, 22 and 24, and between segments 70. In the shown aspect of the invention, conductive material 52 is planarized to have an uppermost surface 51 that is at about the same level as the uppermost surface of segments 70. The segments 70 can have an uppermost surface that is at about the same level as the uppermost surface of line constructions 20, 22 and 24, and accordingly the conductive material 52 can form a plurality of electrically isolated segments across construction 10. One of the electrically isolated segments of electrically-conductive material 52 is designated as a segment 72.

Figure 14:
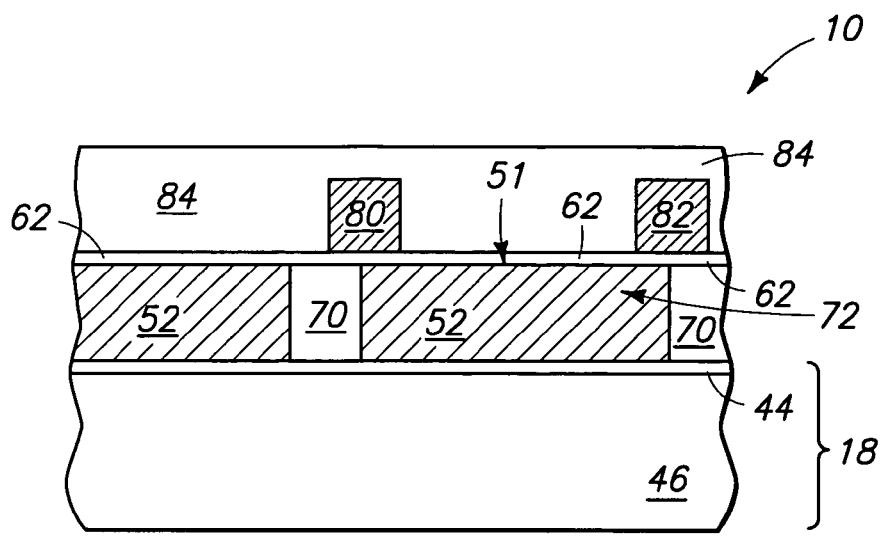
FIG. 14 is a view of the FIG. 13 fragment shown at a processing stage subsequent to that of FIG. 13.

Referring to FIG. 14, the dielectric material 62 is formed over planarized surface 51, and subsequently another layer of circuitry is formed over the dielectric material 62. Such other layer of circuitry comprises a pair of electrical components 80 and 82 which are spaced from one another. A dielectric material 84 extends over and between the components 80 and 82. The components 80 and 82 can comprise any suitable electrically-conductive composition or combination of compositions, and similarly the dielectric material 84 can comprise any suitable electrically insulative composition or combination of compositions.

The conductive components 80 and 82 can be understood to be a part of a layer of circuitry formed at a different elevational level than the level comprising conductive material 52. In the aspect of FIG. 14, such elevational level is above the elevational level of conductive material 52.

Figure 15:
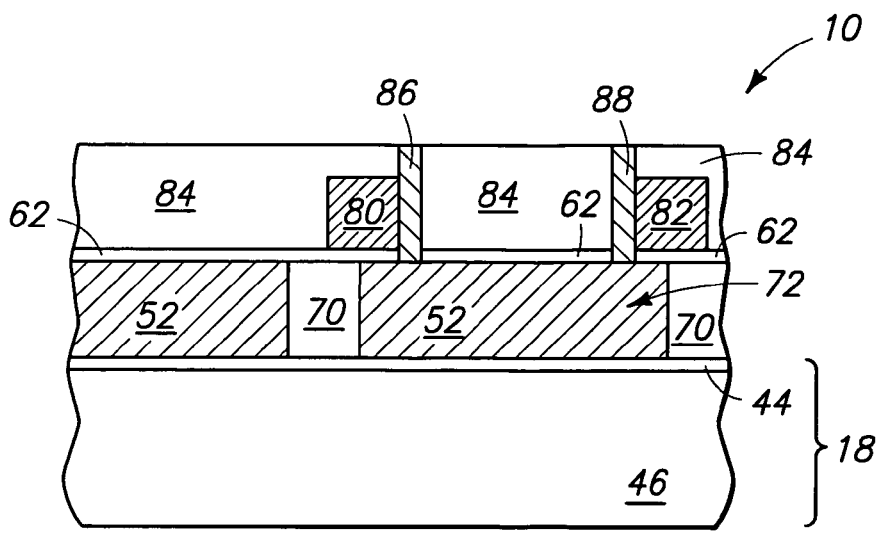
FIG. 15 is a view of the FIG. 13 fragment shown at a processing stage subsequent to that of FIG. 14.

FIG. 15 shows construction 10 at a processing stage subsequent to that of FIG. 14, and specifically shows conductive pedestals 86 and 88 extending through insulative material 84 and dielectric material 62 to connect with conductive material 52 of segment 72. The conductive pedestals 86 and 88 electrically contact conductive components 80 and 82, respectively, and also form electrical connection between such components to a conductive material 52 of segment 72. Accordingly, segment 72 can be utilized as a conductive jumper which electrically connects components 80 and 82 with one another. Utilization of conductive material 52 to electrically couple components 80 and 82 can allow an intervening space between materials 80 and 82 at the elevational level of materials 80 and 82 to be utilized for something other than an electrical contact between the materials. This can enable a higher degree of integration to be achieved at the elevational level of elements 80 and 82 than can be accomplished in the absence of conductive material 52. In some aspects, the components 80 and 82 can be formed to directly contact conductive material 82 (such as, for example, by forming openings extending through dielectric material 62 to material 52, and then form conductive material 82 within the openings), and in such aspects conductive pedestals 86 and 88 can be omitted.

Although the aspect of the invention of FIGS. 14 and 15 shows conductive material 52 utilized as a jumper for connecting circuit elements that are at an elevational level above material 52, it is to be understood that the invention also encompasses aspects in which material 52 is utilized as a jumper for connecting elements that are below the material 52. Such aspect is described with reference to FIGS. 16 and 17.

Figure 16:
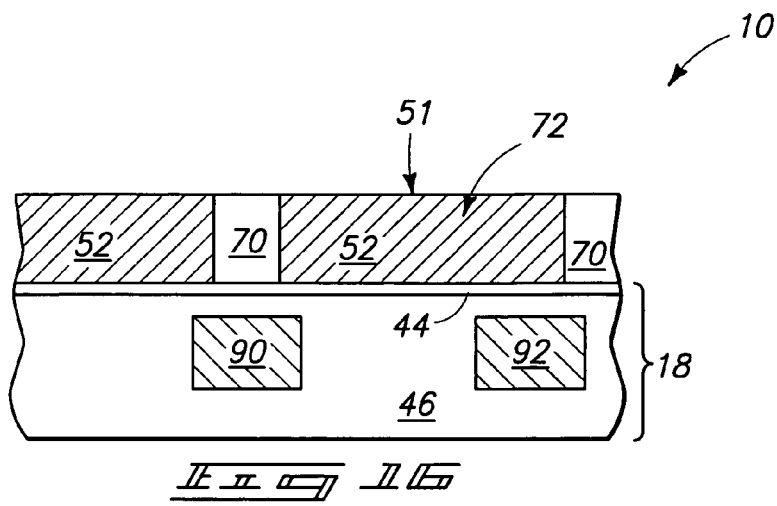
FIG. 16 is a view of the FIG. 13 fragment shown in accordance with an alternative aspect of the invention relative to that described with reference to FIGS. 13-15.

FIG. 16 shows the substrate 18 comprising conductive elements 90 and 92 within the mass 46 and beneath the segment 72 of conductive material 52. The construction of FIG. 16 can be at a processing stage identical to that of FIG. 13, and can be formed with identical processing as discussed above with reference to FIGS. 11-13.

Figure 17:
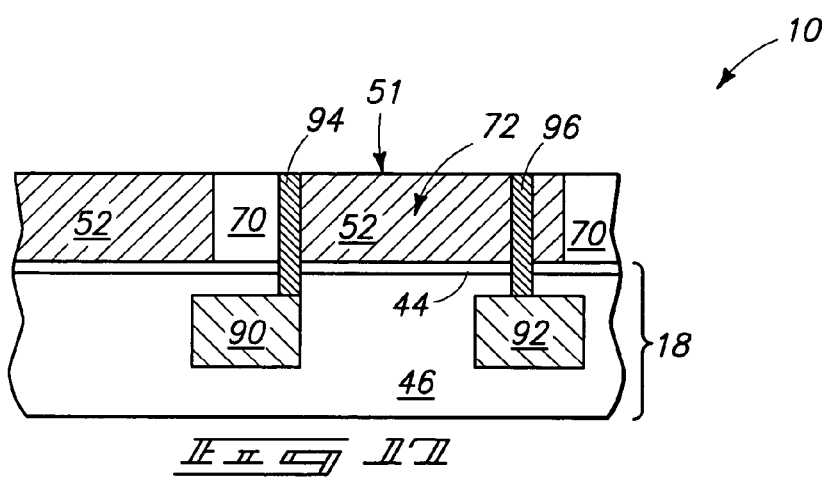
FIG. 17 is a view of the FIG. 16 fragment shown at a processing stage subsequent to that of FIG. 16.

FIG. 17 shows the construction of FIG. 16 after additional processing has been conducted to form conductive pedestals extending through material 52, material 44, and some of material 46 to electrically connect with elements 90 and 92. The pedestals are labeled as 94 and 96, and can comprise any suitable electrically conductive composition or combination of compositions.

In the shown aspect, the pedestals 94 and 96 have an uppermost surface that is substantially planar with surface 51. The construction of FIG. 17 can be created by initially forming openings through materials 52, 44 and 46 where the pedestals are desired, and then filling the openings with conductive material corresponding to the pedestals. The conductive material can be formed as a layer which extends over material 52 and spacers 70, and subsequently chemical-mechanical polishing can be utilized to form the shown planarized upper surface 51 extending across the pedestals 94 and 96, as well as across material 52 and spacers 70.

Figure 18:
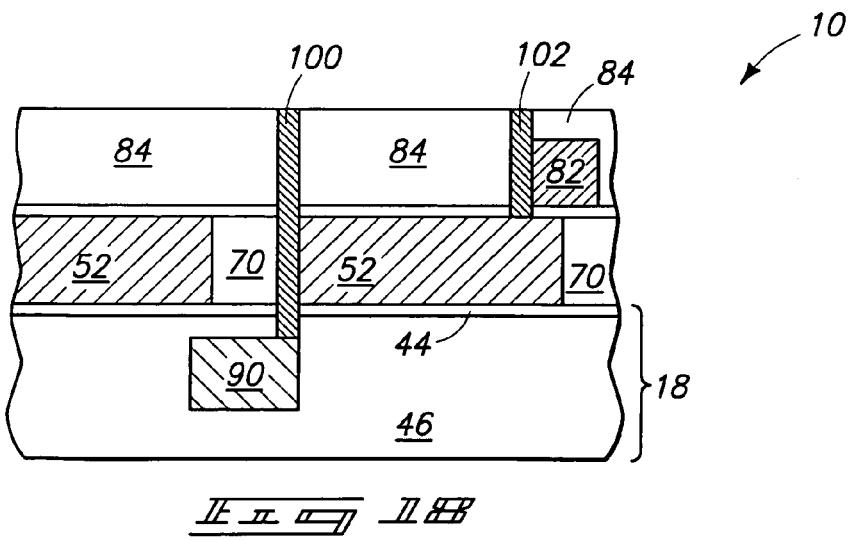
FIG. 18 is a view of a fragment along the cross-section of FIG. 13 and shown in accordance with an another aspect of the invention. The processing stage of FIG. 18 is comparable to that of FIG. 15.

In some aspects, the invention can be utilized for connecting a circuit element below the conductive material 52 with a circuit element above the conductive material. For instance, FIG. 18 illustrates construction 10 comprising an electrically-conductive component 90 beneath the electrically-conductive material 52, and also comprising an electrically-conductive component 82 over the material 52. Conductive pedestals 100 and 102 are formed to extend to contact conductive material 52 and also to contact electrically-conductive components 90 and 82, respectively. Accordingly, the components 82 and 90 are electrically coupled to one another through conductive material 52.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method, comprising:
   providing a semiconductor substrate having a memory array region, a peripheral region proximate the memory array region, and a pitch region between the memory array region and the peripheral region;
   providing a plurality of spaced-apart line constructions extending over the peripheral region and the pitch region, the line constructions containing electrically conductive lines within electrically insulative shells; segments of the line constructions over the pitch region being defined as line constructions of the pitch region, and segments of the line constructions over the peripheral region being defined as line constructions of the peripheral region;
   forming an electrically conductive material between and over the line constructions of one or both of the pitch region and the peripheral region; and
   electrically grounding the electrically conductive material to thereby configure the electrically conductive material as an electrically grounded shield.

2. The method of claim 1 further comprising:
   providing dielectric material between the line constructions;
   removing the dielectric material to leave gaps between the line constructions; and
   forming the electrically conductive material within the gaps to form the electrically conductive material between the line constructions.

3. The method of claim 1 wherein the electrically conductive material is formed to extend over the pitch region.

4. The method of claim 1 wherein the electrically conductive material is formed to extend over the peripheral region.

5. The method of claim 1 wherein the electrically conductive material is formed to extend over the memory array region.

6. The method of claim 1 wherein the electrically conductive material is formed to extend over both the pitch region and the peripheral region.

7. The method of claim 1 wherein the electrically conductive material is formed to extend over the pitch region, the memory array region and the peripheral region.

8. The method of claim 1 further comprising forming an electrically insulative material over the electrically conductive material while the electrically conductive material is over and between the line constructions.

9. A semiconductor processing method, comprising:
   providing a semiconductor substrate having a memory array region, a peripheral region proximate the memory array region, and a pitch region between the memory array region and the peripheral region;
   providing a plurality of spaced-apart line constructions extending over the peripheral region and the pitch region, the line constructions containing electrically conductive lines within electrically insulative shells; segments of the line constructions over the pitch region being defined as line constructions of the pitch region, and segments of the line constructions over the peripheral region being defined as line constructions of the peripheral region;
   forming an electrically conductive material between and over the line constructions of one or both of the pitch region and the peripheral region;
   flowing current within the conductive lines; the current flow creating a magnetic field proximate the conductive lines; and
   flowing current within the electrically conductive material to create magnetic field bias interacting with the magnetic field created by the current flow within the conductive lines.

10. A semiconductor processing method, comprising:
    providing a semiconductor substrate having a memory array region, a peripheral region proximate the memory array region, and a pitch region between the memory array region and the peripheral region;
    providing a plurality of spaced-apart line constructions extending over the peripheral region and the pitch region, the line constructions containing electrically conductive lines within electrically insulative shells; segments of the line constructions over the pitch region being defined as line constructions of the pitch region, and segments of the line constructions over the peripheral region being defined as line constructions of the peripheral region;
    forming an electrically conductive material between and over the line constructions of one or both of the pitch region and the peripheral region;
    flowing current within the conductive lines; the current flow creating a magnetic field proximate the conductive lines; and
    flowing current within the electrically conductive material to create a magnetic field bias opposing the magnetic field created by the current flow within the conductive lines.

11. A semiconductor processing method, comprising:
    providing a semiconductor substrate having a memory array region, a peripheral region proximate the memory array region, and a pitch region between the memory array region and the peripheral region;
    providing a plurality of spaced-apart line constructions extending over the peripheral region and the Ditch region, the line constructions containing electrically conductive lines within electrically insulative shells: segments of the line constructions over the pitch region being defined as line constructions of the pitch region, and segments of the line constructions over the peripheral region being defined as line constructions of the peripheral region;

forming an electrically conductive material between and over the line constructions of one or both of the pitch region and the peripheral region; and wherein the line constructions have uppermost surfaces, and further comprising planarizing the electrically conductive material to remove the electrically conductive material from over the uppermost surfaces of the line constructions while leaving some of the electrically conductive material remaining between the line constructions.

12. The method of claim 11 wherein the electrically conductive material remaining between the line constructions has one or more electrically isolated segments, wherein the electrically conductive material remaining between the line constructions is at a first elevational level over the semiconductor substrate, and wherein circuitry is over the semiconductor substrate at a second elevational level different from the first elevational level, the method further comprising:

forming interconnects between the circuitry and at least one of the one or more segments of the electrically conductive material; and utilizing the at least one segment as an electrical jumper to electrically couple regions of the circuitry with one another.

13. The method of claim 12 wherein the first elevational level is above the second elevational level.

14. The method of claim 12 wherein the first elevational level is below the second elevational level.

15. The method of claim 12 wherein the electrically conductive material and circuitry is over the peripheral region.

16. The method of claim 12 wherein the electrically conductive material and circuitry is over the pitch region.

17. The method of claim 11 wherein the electrically conductive material remaining between the line constructions has one or more electrically isolated segments, wherein the electrically conductive material remaining between the line constructions is at a first elevational level over the semiconductor substrate, and wherein lower circuitry is over the semiconductor substrate at an elevational level below the first elevational level and upper circuitry is over the semiconductor substrate at an elevational level above the first elevational level, the method further comprising:

forming an interconnect between the lower circuitry and one of the segments of the electrically conductive material;

forming an interconnect between the upper circuitry and said one of the segments of the electrically conductive material; and utilizing said one of the segments of the electrically conductive material as an electrical jumper to electrically couple the lower circuitry with the upper circuitry.

18. A semiconductor processing method, comprising:

providing a semiconductor substrate having a memory array region, a peripheral region proximate the memory array region, and a pitch region between the memory array region and the peripheral region;

providing a plurality of spaced-apart line constructions extending over the peripheral region and the pitch region, the line constructions containing electrically conductive lines within electrically insulative shells; segments of the line constructions over the pitch region being defined as line constructions of the pitch region, and segments of the line constructions over the peripheral region being defined as line constructions of the peripheral region;

forming an electrically conductive material between and over the line constructions of one or both of the pitch region and the peripheral region;

removing the electrically conductive material from over the line constructions and leaving the electrically conductive material between the line constructions; and after the removing, forming an electrically insulative material over the electrically conductive material remaining between the line constructions.

* * * * *

UNITED STATES PATENT AND TRADEMARK OFFICE
CERTIFICATE OF CORRECTION

| | |
|---|---|
| PATENT NO. | : 7,557,001 B2 |
| APPLICATION NO. | : 11/175864 |
| DATED | : July 7, 2009 |
| INVENTOR(S) | : Mark Fischer et al. |

It is certified that error appears in the above-identified patent and that said Letters Patent is hereby corrected as shown below:

In column 10, line 60, in Claim 11, delete "Ditch" and insert -- pitch --, therefor.

In column 10, line 62, in Claim 11, delete "shells:" and insert -- shells; --, therefor.

Signed and Sealed this

Twenty-fifth Day of August, 2009

David J. Kappos
*Director of the United States Patent and Trademark Office*